United States Patent
Shpunt et al.

(10) Patent No.: US 10,263,391 B2
(45) Date of Patent: Apr. 16, 2019

(54) HORIZONTAL EXTERNAL-CAVITY LASER GEOMETRY

(71) Applicant: Apple Inc., Cupertino, CA (US)

(72) Inventors: Alexander Shpunt, Portola Valley, CA (US); Andrew J. Sutton, Sunnyvale, CA (US); Yakov G. Soskind, Plainsboro, NJ (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/853,800

(22) Filed: Dec. 24, 2017

(65) Prior Publication Data

US 2019/0074661 A1    Mar. 7, 2019

Related U.S. Application Data

(60) Provisional application No. 62/555,063, filed on Sep. 7, 2017.

(51) Int. Cl.
| | |
|---|---|
| *H01S 3/00* | (2006.01) |
| *H01S 5/183* | (2006.01) |
| *H01S 5/14* | (2006.01) |
| *H01S 3/08* | (2006.01) |
| *H01S 5/022* | (2006.01) |

(52) U.S. Cl.
CPC ............ *H01S 5/141* (2013.01); *H01S 3/0071* (2013.01); *H01S 3/08009* (2013.01); *H01S 3/08059* (2013.01); *H01S 5/02236* (2013.01); *H01S 5/183* (2013.01)

(58) Field of Classification Search
CPC .... H01S 3/08059; H01S 5/141; H01S 3/0071; H01S 5/02236; H01S 3/08009; H01S 5/183
See application file for complete search history.

(56) References Cited

U.S. PATENT DOCUMENTS

| | | | |
|---|---|---|---|
| 6,556,533 B1 * | 4/2003 | Fukakusa | G11B 7/1275 369/112.17 |
| 6,584,136 B2 | 6/2003 | Ju et al. | |
| 6,914,868 B1 | 7/2005 | Redmond et al. | |
| 6,959,027 B1 | 10/2005 | Guilfoyle et al. | |
| 8,139,448 B1 * | 3/2012 | Hirano | G11B 5/105 369/112.27 |
| 2005/0046011 A1 * | 3/2005 | Chen | H05K 1/0274 257/705 |

(Continued)

OTHER PUBLICATIONS

International Application # PCT/US2018/38140 search report dated Sep. 14, 2018.

*Primary Examiner* — Yuanda Zhang

(74) *Attorney, Agent, or Firm* — Kligler & Associates

(57) ABSTRACT

An optoelectronic device includes a semiconductor substrate and a vertical-cavity surface-emitting laser (VCSEL) light source formed on the substrate and configured to emit coherent light at a predefined wavelength along a beam axis perpendicular to a surface of the substrate. A block of a transparent material is mounted on the surface of the substrate and forms, with the VCSEL, a resonant cavity at the predefined wavelength having an entrance face that is aligned with the beam axis and an exit face that is laterally displaced with respect to the entrance face along a cavity axis running parallel to the surface of the substrate.

18 Claims, 5 Drawing Sheets

(56) References Cited

U.S. PATENT DOCUMENTS

| | | | | |
|---|---|---|---|---|
| 2005/0105406 A1* | 5/2005 | Sohn | ............... | G11B 7/124 |
| | | | | 369/44.12 |
| 2007/0047600 A1* | 3/2007 | Luo | ............... | H01S 3/0627 |
| | | | | 372/21 |
| 2009/0225797 A1* | 9/2009 | Kuhnelt | ............ | H01S 5/02248 |
| | | | | 372/22 |
| 2010/0265975 A1* | 10/2010 | Baier | ............... | H01S 5/065 |
| | | | | 372/29.014 |
| 2012/0327754 A1 | 12/2012 | Olson | | |

* cited by examiner

HORIZONTAL EXTERNAL-CAVITY LASER GEOMETRY

CROSS-REFERENCE TO RELATED APPLICATION

This application claims the benefit of U.S. Provisional Patent Application 62/555,063, filed Sep. 7, 2017, which is incorporated herein by reference.

FIELD OF THE INVENTION

The present invention relates generally to optoelectronic devices, and particularly to laser systems.

BACKGROUND

A laser is made up of an optical gain medium and a resonant cavity, with the gain medium contained inside the resonant cavity. The resonant cavity defines characteristics of the output laser beam. External-cavity lasers typically include additional, external optical elements, defining a resonant cavity. The external cavity is typically significantly longer than the resonant cavity of the laser. The use of an external cavity increases the overall length of the laser, simultaneously reducing the divergence of the output beam and allowing better control over spatial mode and frequency selection.

SUMMARY

Embodiments of the present invention that are described hereinbelow provide improved designs for semiconductor lasers with external resonator cavities.

There is therefore provided, in accordance with an embodiment of the invention, an optoelectronic device, including a semiconductor substrate and a vertical-cavity surface-emitting laser (VCSEL) light source formed on the substrate and configured to emit coherent light at a predefined wavelength along a beam axis perpendicular to a surface of the substrate. A block of a transparent material is mounted on the surface of the substrate and forms, with the VCSEL, a resonant cavity at the predefined wavelength having an entrance face that is aligned with the beam axis and an exit face that is laterally displaced with respect to the entrance face along a cavity axis running parallel to the surface of the substrate.

In some embodiments, the block of the transparent material includes a first side adjacent to the substrate and including the entrance face, and a second side opposite the first side and including the exit face, wherein the first side and the second side are parallel to the surface of the substrate. In some of these embodiments, the block of the transparent material includes third and fourth sides, not parallel to the first and second sides, wherein the third side is configured to receive the emitted light through the entrance face and to reflect the received light along the cavity axis, and the fourth side configured to reflect the light propagating within the resonant cavity toward the exit face. In a disclosed embodiment, the exit face is configured to reflect more than 60% of the light that is incident on the exit face at the predefined wavelength. The third and fourth sides may be planar or curved.

In a disclosed embodiment, the exit face includes an optical element having a curved surface.

In one embodiment, the entrance face includes a grating configured to diffract the emitted light into the block toward the cavity axis. Additionally or alternatively, the exit face includes a grating configured to retro-reflect a first portion of the light propagating in the cavity while diffracting a second portion of the propagating light out through the exit face.

In another embodiment, the first side includes both the entrance face and a grating configured to retro-reflect a first portion of the light propagating in the cavity and to reflect a second portion of the propagating light towards the exit face.

In some embodiments, the light propagates through the resonant cavity from the entrance face to the exit face by total internal reflection between first and second sides of the block of the transparent material. In one embodiment, the block of the transparent material includes a reflector formed on a third side of the block, perpendicular to the first and second sides, wherein the reflector is configured to reflect the light propagating within the resonant cavity. In another embodiment, the block of the transparent material includes a grating that is formed in one of the sides of the block and is configured to retro-reflect the light propagating through the cavity.

In a disclosed embodiment, the block of the transparent material includes a volume grating adjacent to the entrance face and configured to diffract the emitted light into the block toward the cavity axis. Additionally or alternatively, the block of the transparent material includes a volume grating configured to diffract a portion of the propagating light out through the exit face.

There is also provided, in accordance with an embodiment of the invention, a method for producing an optoelectronic device. The method includes providing a vertical-cavity surface-emitting laser (VCSEL) light source formed on a semiconductor substrate and configured to emit coherent light at a predefined wavelength along a beam axis perpendicular to a surface of the substrate. A block of a transparent material is mounted on the surface of the substrate so as to form, with the VCSEL, a resonant cavity at the predefined wavelength having an entrance face that is aligned with the beam axis and an exit face that is laterally displaced with respect to the entrance face along a cavity axis running parallel to the surface of the substrate.

The present invention will be more fully understood from the following detailed description of the embodiments thereof, taken together with the drawings in which:

DETAILED DESCRIPTION OF EMBODIMENTS

Overview

VCSELs (vertical-cavity surface-emitting lasers) are useful in a wide range of applications, due to their low power consumption, high reliability, scalability to high production volumes, and a reasonable quality of the emitted beam.

The spatial mode profile of the emitted beam, as well as its spectral selectivity, can be further improved by coupling an external cavity to the VCSEL. Such a device is typically formed from additional structures within the VCSEL substrate, or from either a dielectric or hollow structure with one end coupled to the output of the VCSEL and receiving the emitted beam. The second end, referred to as an output coupler, passes a portion of the propagating light out from the external cavity, and reflects a portion of the propagating light back into the external cavity, thus producing the required feedback within the laser cavity for sustainable generation of the output laser beam. The quantity of light reflected by the output coupler depends upon optical design requirements, with typical values of 60-95%. The external cavity is typically either placed in close proximity to the VCSEL or monolithically integrated with the VCSEL and fabricated as a part of the VCSEL fabrication process (and an anti-reflective coating may be formed over the VCSEL medium to prevent parasitic reflections within the cavity). The external cavity forms, together with the VCSEL, a coupled resonator, which will affect both the spatial and spectral mode structure of the light emitted from the laser.

Orienting the external cavity to be parallel to the beam emitted by the VCSEL (i.e., perpendicular to the surface of the substrate on which the VCSEL is formed) provides a simple and straightforward solution, but the resulting structure adds considerably to the thickness of the light source. Moreover, adding an external cavity that stands perpendicular to the substrate and substantially exceeding the typical substrate thickness, may complicate the fabrication process and require an accurate alignment of the external cavity with respect to the VCSEL.

The embodiments of the present invention that are described herein address the above limitations of fabrication and alignment so as to enable the fabrication of compact light sources comprising a VCSEL and an external cavity. The disclosed embodiments use a VCSEL formed on a substrate and configured to emit coherent light at a predefined wavelength along a beam axis perpendicular to a surface of the substrate, and a block of a transparent material mounted on the surface of the substrate and forming with the VCSEL a resonant cavity at the predefined wavelength. The block is typically solid, but may alternatively be hollow. The cavity has an entrance face that is aligned with the beam axis and an exit face that is laterally displaced with respect to the entrance face along a cavity axis running parallel to the surface of the substrate.

System Description

Figure 1:
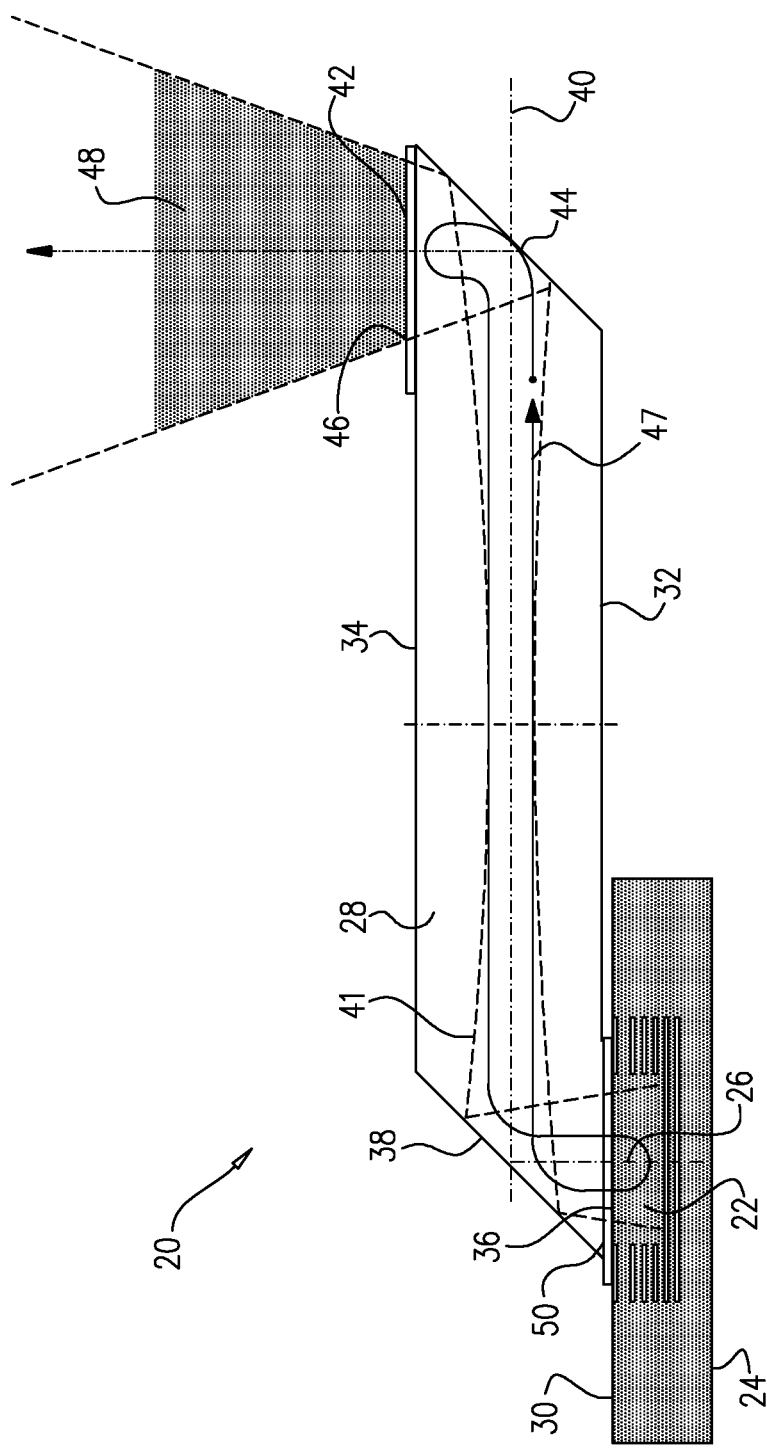
FIGS. 1-9 are schematic sectional views of optoelectronic devices configured as external-cavity lasers, in accordance with various embodiments of the invention.

FIG. 1 is a schematic sectional view of an optoelectronic device 20, in accordance with an embodiment of the invention. A VCSEL 22 is formed on a semiconductor substrate 24, using fabrication techniques that are known in the art. VCSEL 22 emits coherent light at a predefined wavelength along a beam axis 26. A block 28 of a transparent material, such as a suitable glass or other dielectric or semiconductor material, is mounted on a surface 30 of substrate 24. Block 28 comprises a first side 32, adjacent to surface 30, and a second side 34 opposite to the first side, wherein both sides 32 and 34 are parallel to surface 30. First side 32 comprises an entrance face 36 aligned with beam axis 26. For purposes of the present embodiment, block 28 is typically 10-50 μm thick and 100-1000 μm long, wherein thickness is the dimension perpendicular to first side 32 and second side 34, and length is the dimension parallel to these sides. The thickness and length of block 28 represent the external cavity design parameters. Blocks of larger or smaller dimensions may be used, depending on the combination of the application of the optoelectronic device and the emission area of the VCSEL, as well as the fabrication technologies and optical components that are used, as further described below.

Block 28 further comprises a third side 38, which is not parallel to the first and second sides 32 and 34, respectively.

In the present embodiment, third side 38 is planar, and configured to receive the emitted light through entrance face 36 and to reflect the received light along a cavity axis 40 (marked by a dash-dot-dot-line). In the context of the present description and in the claims, the cavity axis is defined as the projection of a central ray of a laser beam 41 propagating in the cavity onto a plane that is parallel to surface 30. In the present embodiment, cavity axis 40 coincides with this central ray.

Second side 34 comprises an exit face 42 that is laterally displaced with respect to entrance face 36 and VCSEL along cavity axis 40. In other words, in contrast to vertical external cavities, exit face 42 is not aligned with entrance face 36 along beam axis 36.

Block 28 further comprises a fourth side 44, which is not parallel to first and second sides 32 and 34. Fourth side 44 in this embodiment is planar, and configured to receive the light directed (i.e., reflected) by third side 38, and to further direct (reflect) it to exit face 42. Exit face 42 comprises a mirror coating 46 for output coupling that is configured to reflect typically 60-95% of the light received from fourth side 44, and to transmit the light, which is not reflected or absorbed by the mirror coating, out from block 28 as coherent light 48.

Third side 38 and fourth side 44 reflect the light propagating within block 28 based on total internal reflection, providing that the entrance angles of the light impinging onto the two sides, as well as the refractive index of the transparent material of block 28, support total internal reflection. Alternatively, third side 38 and fourth side 44 may be coated with a reflective coating, such as aluminum. Further alternatively, diffraction gratings may be formed on third side 38 and fourth side 44 for achieving deflection (reflection) of the light within the operative diffraction orders of the gratings from the two sides.

Block 28, including third side 38, fourth side 44, and exit face 42 with mirror coating 46, together with VCSEL 22, thus forms a resonant cavity at a wavelength within the emission spectrum of the VCSEL. The circulation of photons within this cavity is illustrated in FIG. 1 by a circulating arrow 47 within beam 41.

Entrance face 36 may additionally comprise an optical element 50, such as a homogeneous or gradient-index refractive lens, or a transmitting diffractive optical element, for modifying the mode structure of the light propagating within block 28. Furthermore, this sort of element with optical power may be incorporated in other embodiments.

Exit face 42 may be configured either as a planar or a curved reflective surface, or it may comprise a refractive optical element, such as a lens. Furthermore, this sort of curved surface or refractive optical element may be incorporated in other embodiments.

Additional electronic, optoelectronic, and mechanical components (not shown in the figures) may be incorporated in other embodiments. One or more radiation detectors may be added, wherein the detectors are located below block 28 and configured to receive light through the block. Support structures may be added to maintain the mechanical integrity of the optoelectronic device.

Figure 2:
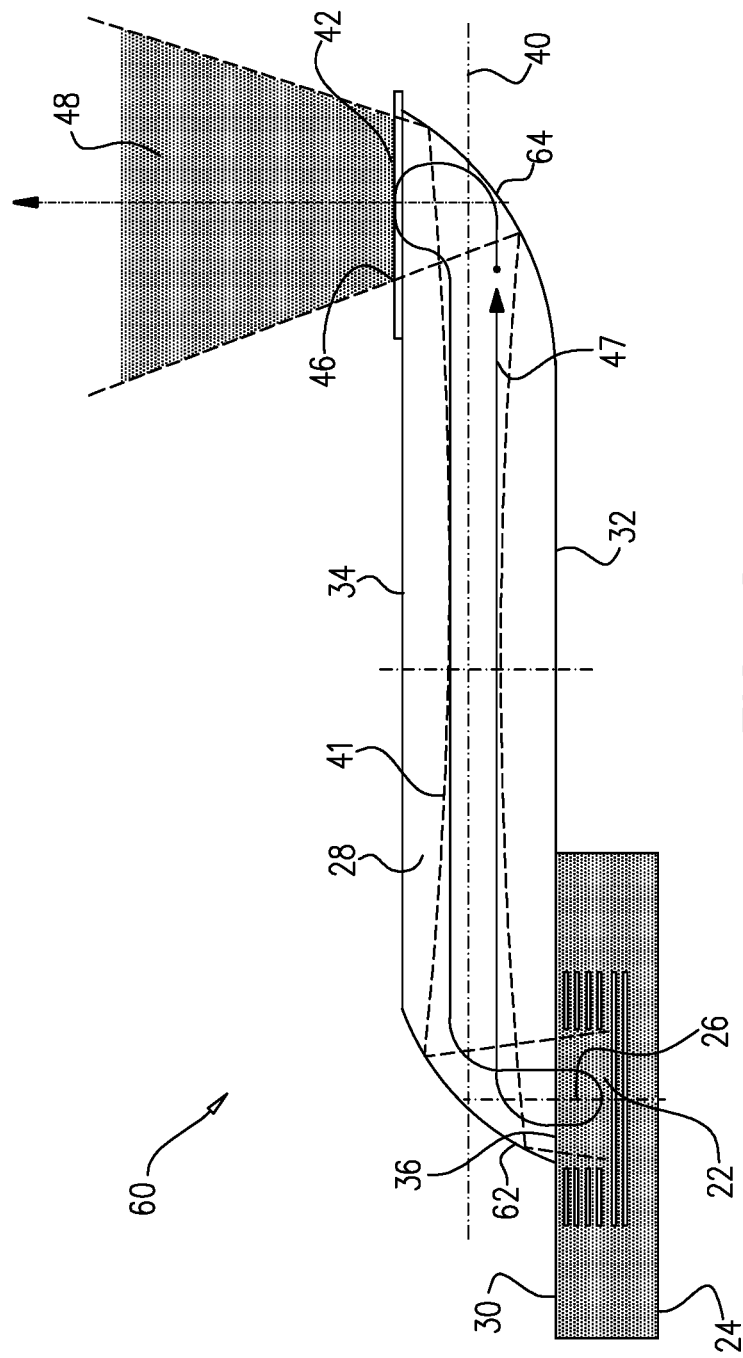

FIG. 2 is a schematic sectional view of an optoelectronic device 60, in accordance with another embodiment of the invention. Optoelectronic device 60 is substantially similar to optoelectronic device 20 of FIG. 1, and identical or substantially identical items are labelled with the same labels as in FIG. 1. The primary difference between optoelectronic device 20 and optoelectronic device 60 is that, whereas the former comprises planar third and fourth sides 38 and 44, respectively, the latter comprises a curved third side 62 and a curved fourth side 64. The respective radii of curvature of curved third and fourth sides 62 and 64 may be either positive or negative. In the pictured embodiment, the positive radii of curvature cause the light impinging on the surface to converge after reflection. Alternatively, a negative radius of curvature will cause the light impinging on the surface to diverge after reflection.

By choosing the signs and magnitudes of the radii of curvature of curved sides 62 and 64 appropriately, the resonant cavity formed by block 28, including curved sides 62 and 64 and exit face 42 with mirror coating 46, together with VCSEL 22, may be configured either as a stable resonator or as an unstable resonator, as is known in the art. In other embodiments (not shown in the figures), the external cavity may be configured as an unstable resonator by using mirrors with apodized coatings or high diffraction losses.

Figure 3:
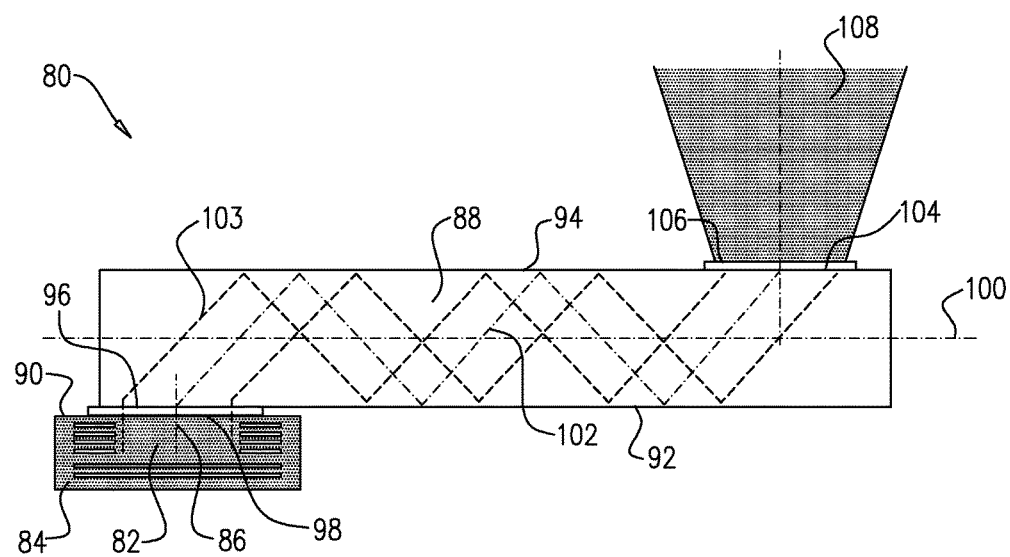

FIG. 3 is a schematic sectional view of an optoelectronic device 80, in accordance with yet another embodiment of the invention.

As in the preceding embodiments, a VCSEL 82 is formed on a substrate 84 and emits coherent light at a predefined wavelength along a beam axis 86. A block 88 of transparent material is mounted on a surface 90 of substrate 84. Block 88 comprises a first side 92, adjacent to surface 90, and a second side 94 opposite to the first side, wherein both sides 92 and 94 are parallel to surface 90. First side 92 comprises an entrance face 96 aligned with beam axis 86.

Entrance face 96 comprises a first diffraction grating 98, which receives and transmits the light emitted by VCSEL 82 through entrance face 96 and redirects the transmitted light by diffraction at an angle toward a cavity axis 100 (marked by a dash-dot-dot-line). Diffraction angle $\theta_b$ within block 88 depends on the wavelength $\lambda$ and the angle of incidence $\theta_i$ of the propagating light, the working diffraction order m, the grating period d, and the refractive indices $n_i$ of the medium before the grating and $n_b$ of the material of block 88:

$$\sin(\theta_b) = \frac{1}{n_b}\left(n_i \sin(\theta_i) + \frac{m\lambda}{d}\right) \quad (1)$$

When the output beam from VCSEL 82 is incident on grating 98 at normal incidence ($\theta_i = 0$), the diffracted angle $\theta_b$ can be found from equation (1) as:

$$\theta_b = \sin^{-1}\left(\frac{m\lambda}{n_b d}\right) \quad (2)$$

Diffraction grating 98, as well as the other diffraction gratings described hereinbelow, can be made as surface relief or volume gratings, and can be produced by any suitable method that is known in the art, such as etching or stamping the surface of entrance face 96, or holographic recording. Here again, cavity axis 100 is defined as the projection of a central ray 102 (marked by a dash-dot-line) of a laser beam 103 propagating in block onto a plane that is parallel to surface 90. The diffracted light propagates within block 88 by being totally internally reflected between first side 92 and second side 94. The condition for total internal reflection within block 88 is satisfied when the diffraction angle $\theta_b$ exceeds the critical angle $\theta_c$ within the block 88, defined as:

$$\theta_c = \sin^{-1}\left(\frac{1}{n_b}\right) \quad (3)$$

Alternatively, first and second sides 92 and 94 of block 88 can be coated with reflective coatings.

Second side 94 comprises an exit face 104 that is laterally displaced with respect to entrance face 96 along cavity axis 100. Exit face 104 comprises a second diffraction grating 106, which retro-reflects (in a so-called Littrow configuration) typically 60-95% of the light it receives, and transmits the remaining light, which is not reflected or absorbed by the grating, out from block 88 as coherent light 108.

Block 88, together with second diffraction grating 106 and VCSEL 82, thus forms a resonant cavity at a wavelength within the emission spectrum of the VCSEL.

First and second diffraction gratings 98 and 106 may have additional optical power for altering the curvature and angle of the wavefront of the propagating light, and thereby modifying the mode structure and the propagation direction of the light within block 88. Furthermore, this sort of diffraction grating with optical power may be incorporated in other embodiments.

Second diffraction grating 106 may be configured to diffract a single diffraction order or multiple diffraction orders of coherent light 108. Multiple diffraction orders can be useful when a wide output beam spread is desired. Furthermore, this sort of diffraction grating with one or multiple diffraction orders may be incorporated in other embodiments. Although the transmitted portion of light through second diffraction grating 106 is shown exiting block 88 through the exit face 104 at 90° with respect to side 94, the period and spacing of grating 106 can be selected, in accordance with the diffraction equation (1), so that the output beam will exit the cavity at a different angle with respect to side 94.

Figure 4:
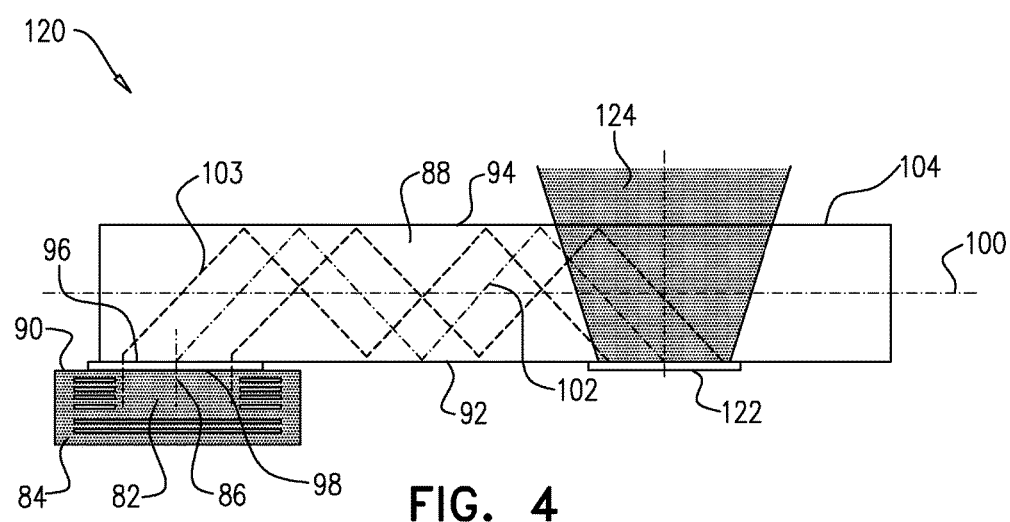

FIG. 4 is a schematic sectional view of an optoelectronic device 120, in accordance with still another embodiment of the invention. Optoelectronic device 120 is substantially similar to optoelectronic device 80 of FIG. 3, and identical or substantially identical items are labelled with the same labels as in FIG. 3. The primary difference between optoelectronic device 120 and optoelectronic device 80 of FIG. 3 is that, whereas the former comprises second diffraction grating 106 formed on exit face 104, the latter comprises a second diffraction grating 122 formed on first side 92 opposite exit face 104. Second diffraction grating 122 is configured to retro-reflect typically 60-95% of the light it receives. The remaining light, which is not retro-reflected or absorbed by second diffraction grating 122, is diffracted toward exit face 104, where it exits out from block 88 as coherent light 124.

Block 88, together with second diffraction grating 122 and VCSEL 82, forms a resonant cavity at a wavelength within the emission spectrum of the VCSEL.

Figure 5:
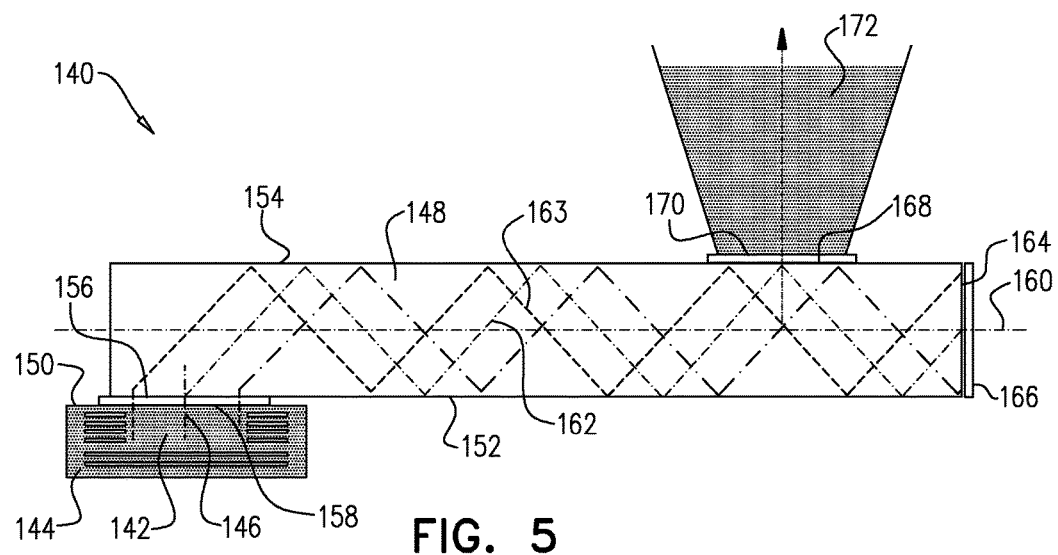

FIG. 5 is a schematic sectional view of an optoelectronic device 140, in accordance with a further embodiment of the invention.

A VCSEL 142 is formed on a substrate 144 and emits coherent light at a predefined wavelength along a beam axis 146. A block 148 of transparent material is mounted on a surface 150 of substrate 144. Block 148 comprises a first side 152, adjacent to surface 150, and a second side 154 opposite to the first side, wherein both sides 152 and 154 are parallel to surface 150. First side 152 comprises an entrance face 156 aligned with beam axis 146.

Entrance face 156 comprises a first diffraction grating 158, which receives the emitted light through entrance face 156 and diffracts the received light toward a cavity axis 160 (marked by a dash-dot-dot-line). Here again, the cavity axis is defined as the projection of a central ray 162 (marked by a dash-dot-line) of a laser beam 163 propagating in block 148 onto a plane that is parallel to surface 150. The diffracted light propagates within block 148 by either being totally internally reflected by first side 152 and second side 154, or reflected due to surface coatings.

Block 148 further comprises a third side 164, which is perpendicular to first side 152 and second side 154. Third side 164 comprises a reflector 166, which may comprise either a mirror or a diffraction grating.

Second side 154 comprises an exit face 168 that is laterally displaced with respect to entrance face 156 along cavity axis 160. Exit face 168 comprises a diffraction grating 170, which is configured to reflect specularly a majority of the light it receives, and to transmit a small proportion of the remaining light, which is not reflected or absorbed by the second diffraction grating, out from block 148 as coherent light 172. The diffractive element 168 is passed by the light both in the forward and return directions, and is configured to have a sufficiently high reflectivity in order to maintain a desired ratio between output and recirculated power for the external cavity.

Block 148, together with reflector 166 and VCSEL 82, forms a resonant cavity at a wavelength within the emission spectrum of the VCSEL.

Modes of light propagating within block 148 may be selected by appropriate choice of the sizes of first diffraction grating 158 and second diffraction grating 170, as well as using the angular selectivity of reflector 166. Furthermore, this sort of mode selection may be incorporated in other embodiments.

Figure 6:
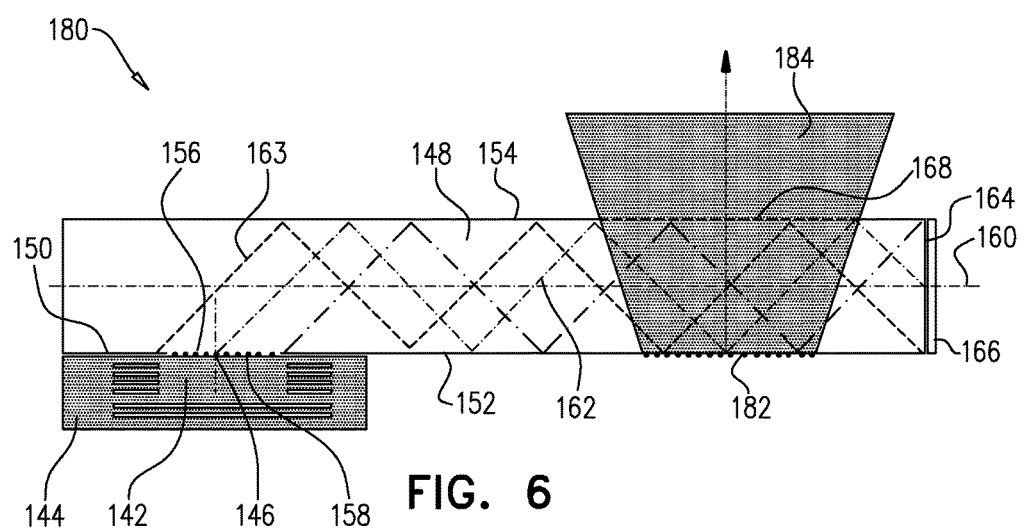

FIG. 6 is a schematic sectional view of an optoelectronic device 180, in accordance with yet a further embodiment of the invention. Optoelectronic device 180 is substantially similar to optoelectronic device 140 of FIG. 5, and identical or substantially identical items are labelled with the same labels as in FIG. 5. The primary difference between optoelectronic device 180 and optoelectronic device 140 of FIG. 5 is that, whereas the former comprises diffraction grating 170 formed on exit face 168, the latter comprises a diffraction grating 182 formed on first side 152 opposite exit face 168. Diffraction grating 182 is configured to reflect specularly typically 60-95% of the light it receives, and to diffract the remaining light, which is not reflected or absorbed by the second diffraction grating, towards exit face 168, where it exits from block 148 as coherent light 184.

Block 148, together with reflector 166 and VCSEL 142, forms a resonant cavity at a wavelength within the emission spectrum of the VCSEL.

Figure 7:
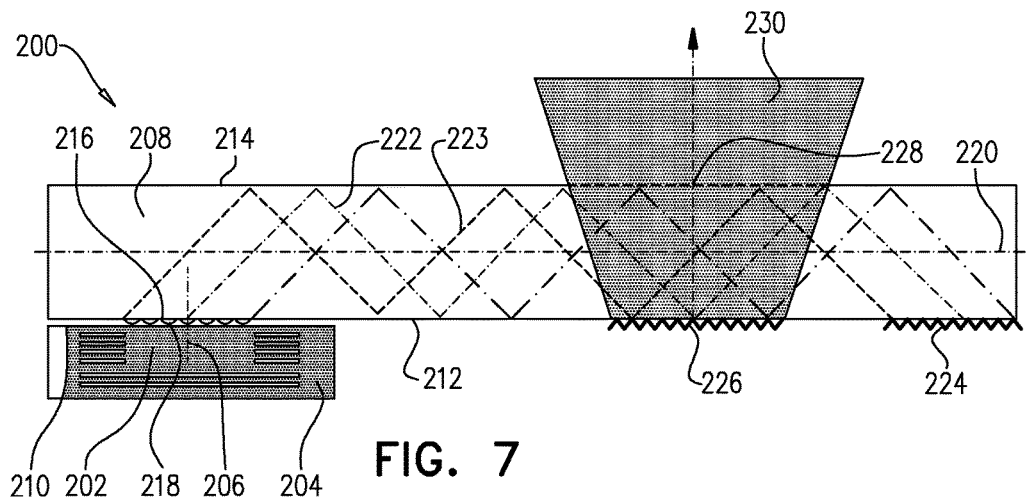

FIG. 7 is a schematic sectional view of an optoelectronic device 200, in accordance with an additional embodiment of the invention.

A VCSEL 202 is formed on a substrate 204 and configured to emit coherent light at a predefined wavelength along a beam axis 206. A block of transparent material 208 is mounted on a surface 210 of substrate 204. Block 208 comprises a first side 212, adjacent to surface 210, and a second side 214 opposite to the first side, wherein both sides 212 and 214 are parallel to surface 210. First side 212 comprises an entrance face 216 aligned with beam axis 206.

Entrance face 216 comprises a first diffraction grating 218, which receives the emitted light through entrance face 206 and diffracts the received light toward a cavity axis 220 (marked by a dash-dot-dot-line). Here again, the cavity axis is defined as the projection of a central ray 222 (marked by a dash-dot-line) of a laser beam 223 propagating in block 208 onto a plane that is parallel to surface 210. The diffracted light propagates within block 208 by being totally internally reflected by first side 212 and second side 214.

First side 212 further comprises a second diffraction grating 224 and a third diffraction grating 226. Second diffraction grating 224 retro-reflects the light propagating within block 208. Second side 214 comprises an exit face 228 opposite third diffraction grating 226. Third diffraction grating 226 is configured to reflect specularly typically 60-95% of the light it receives, and to diffract the remaining light, which is not reflected or absorbed by the third diffraction grating, towards exit face 228, where it exits from block 208 as coherent light 230.

Block 208, together with second diffraction grating 224 and VCSEL 202, forms a resonant cavity at a wavelength within the emission spectrum of the VCSEL.

An advantage of the embodiment of FIG. 7 is that all three diffraction gratings (first diffraction grating 218, second diffraction grating 224, and third diffraction grating 226) are fabricated on the same side of block 208.

Figure 8:
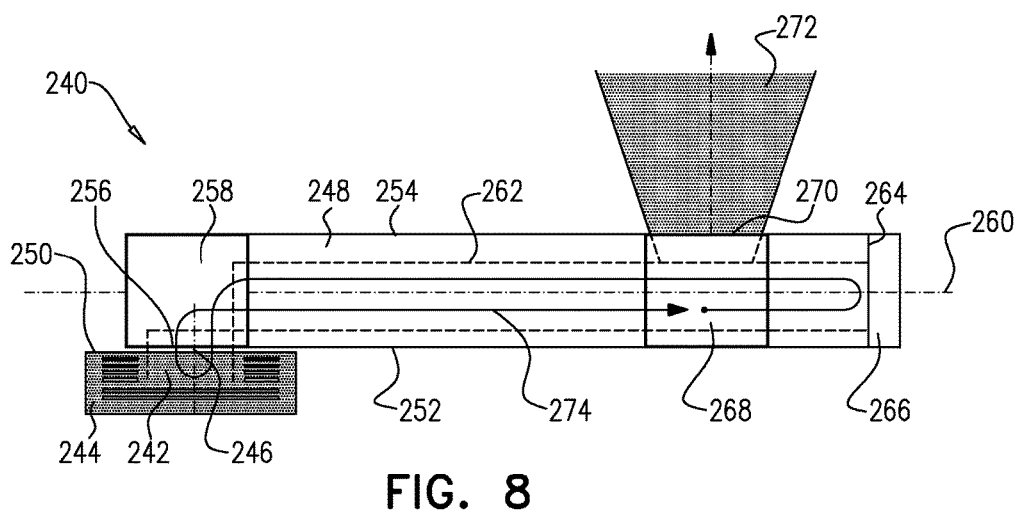

FIG. 8 is a schematic sectional view of an optoelectronic device 240, in accordance with an alternative embodiment of the invention.

A VCSEL 242 is formed on a substrate 244 and emits coherent light at a predefined wavelength along a beam axis 246. A block of transparent material 248 is mounted on a surface 250 of substrate 244. Block 248 comprises a first side 252, adjacent to surface 250, and a second side 254 opposite to the first side, wherein both sides 252 and 254 are parallel to surface 250. First side 252 comprises an entrance face 256 aligned with beam axis 246.

Block 248 comprises a first volume grating 258 adjacent to entrance face 256, which diffracts the emitted light into the block toward a cavity axis 260 (marked by a dash-dot-dot-line). Volume gratings comprise volumetrically distributed modulations of refractive index, and are typically fabricated using a holographic recording process. Photo-thermo-refractive glass is commonly used to produce volume gratings in laser applications, as it has relatively high laser damage threshold. Here, too, the cavity axis is defined as the projection of a central ray of a laser beam 262 propagating in block 248 onto a plane that is parallel to surface 250. In this embodiment, cavity axis 260 coincides with the central ray of beam 262.

Block 248 comprises a third side 264, which is perpendicular to first side 252 and second side 254. Third side 264 comprises a reflector 266, which may comprise either a mirror or a diffraction grating.

Block 248 further comprises a second volume grating 268. Second side 254 comprises an exit face 270, aligned with second volume grating 268. Second volume grating 268 diffracts a portion of the light propagating within block 248 toward exit face 270 and out of block 248 as coherent light 272.

Block 248, together with reflector 266 and VCSEL 242, forms a resonant cavity at a wavelength within the emission spectrum of the VCSEL. The circulation of photons within this cavity is illustrated in FIG. 8 by a circulating arrow 274 within beam 262.

Figure 9:
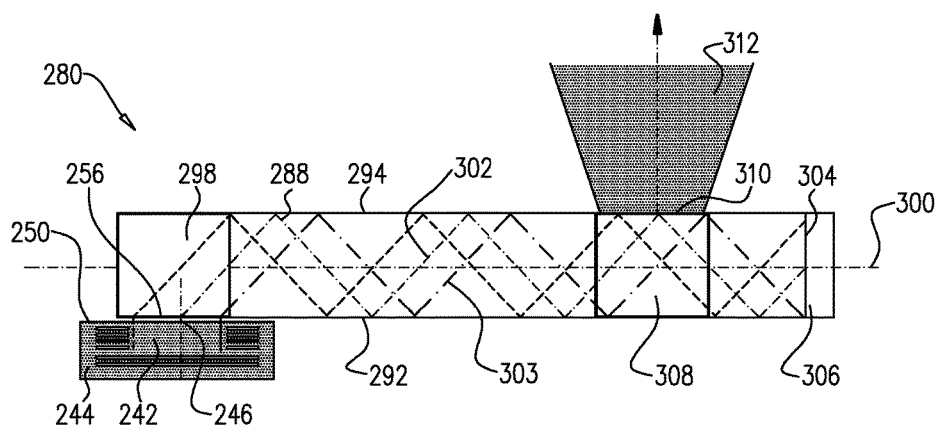

FIG. 9 is a schematic sectional view of an optoelectronic device 280, in accordance with one more embodiment of the invention.

A VCSEL 282 is formed on a substrate 284 and configured to emit coherent light at a predefined wavelength along a beam axis 286. A block 288 of transparent material is mounted on a surface 290 of substrate 284. Block 288 comprises a first side 292, adjacent to surface 290, and a second side 294 opposite to the first side, wherein both sides 292 and 294 are parallel to surface 290. First side 292 comprises an entrance face 296 aligned with beam axis 296.

Block 288 comprises a first volume grating 298 adjacent to entrance face 296, which diffracts the emitted light into the block toward a cavity axis 300 (marked by a dash-dot-dot-line). The cavity axis is defined as the projection of a central ray 302 (marked by a dash-dot-line) of a laser beam 303 propagating in block 288 onto a plane that is parallel to surface 290. The reflected light propagates within block 288 by being totally internally reflected by first side 292 and second side 294.

Block 288 comprises a third side 304, which is perpendicular to first side 292 and second side 294. Third side 304 comprises a reflector 306, which may comprise either a mirror or a diffraction grating.

Block 288 further comprises a second volume grating 308. Second side 294 comprises an exit face 310, aligned with second volume grating 308. Second volume grating 308 diffracts a portion of the light propagating within block 288 towards exit face 310 and out of block 288 as coherent light 312.

Block 288, together with reflector 306 and VCSEL 282, forms a resonant cavity at a wavelength within the emission spectrum of the VCSEL.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a semiconductor substrate;
   a vertical-cavity surface-emitting laser (VCSEL) light source formed on the substrate and configured to emit coherent light at a predefined wavelength along a beam axis perpendicular to a surface of the substrate; and
   a block of a transparent material comprising opposing first and second sides that are parallel to the surface of the substrate, such that the first side is adjacent to and mounted on the surface of the substrate, and the block of the transparent material forms, with the VCSEL, a resonant cavity at the predefined wavelength having an entrance face on the first side of the block of the transparent material that is aligned with the beam axis and an exit face on the second side of the block of the transparent material that is laterally displaced with respect to the entrance face along a cavity axis running between the first and second sides of the block of the transparent material in a direction parallel to the surface of the substrate.

2. The optoelectronic device of claim 1, wherein the block of the transparent material comprises third and fourth sides, not parallel to the first and second sides, wherein the third side is configured to receive the emitted light through the entrance face and to reflect the received light along the cavity axis, and the fourth side configured to reflect the light propagating within the resonant cavity toward the exit face.

3. The optoelectronic device of claim 2, wherein the exit face is configured to reflect more than 60% of the light that is incident on the exit face at the predefined wavelength.

4. The optoelectronic device of claim 2, wherein the third and fourth sides are planar.

5. The optoelectronic device of claim 2, wherein the third and fourth sides are curved.

6. The optoelectronic device of claim 1, wherein the exit face comprises an optical element having a curved surface.

7. The optoelectronic device of claim 1, wherein the entrance face comprises a grating configured to diffract the emitted light into the block toward the cavity axis.

8. The optoelectronic device of claim 1, wherein the exit face comprises a grating configured to retro-reflect a first portion of the light propagating in the cavity while diffracting a second portion of the propagating light out through the exit face.

9. The optoelectronic device of claim 1, wherein the first side comprises both the entrance face and a grating configured to retro-reflect a first portion of the light propagating in the cavity and to reflect a second portion of the propagating light towards the exit face.

10. The optoelectronic device of claim 1, wherein the light propagates through the resonant cavity from the entrance face to the exit face by total internal reflection between first and second sides of the block of the transparent material.

11. The optoelectronic device of claim 10, wherein the block of the transparent material comprises a reflector formed on a third side of the block, perpendicular to the first and second sides, wherein the reflector is configured to reflect the light propagating within the resonant cavity.

12. The optoelectronic device of claim 10, wherein the block of the transparent material comprises a grating that is formed in one of the sides of the block and is configured to retro-reflect the light propagating through the cavity.

13. The optoelectronic device of claim 1, wherein the block of the transparent material comprises a volume grating adjacent to the entrance face and configured to diffract the emitted light into the block toward the cavity axis.

14. The optoelectronic device of claim 1, wherein the block of the transparent material comprises a volume grating configured to diffract a portion of the propagating light out through the exit face.

15. A method for producing an optoelectronic device, the method comprising:
   providing a vertical-cavity surface-emitting laser (VCSEL) light source formed on a semiconductor substrate and configured to emit coherent light at a predefined wavelength along a beam axis perpendicular to a surface of the substrate; and
   mounting a first side of a block of a transparent material on the surface of the substrate so as to form, with the VCSEL, a resonant cavity at the predefined wavelength having an entrance face on the first side of the block of the transparent material that is aligned with the beam axis and an exit face on a second side of the block of the transparent material, opposite the first side, that is laterally displaced with respect to the entrance face along a cavity axis running between the first and second sides of the block of the transparent material, in a direction parallel to the surface of the substrate, wherein the first side and the second side are parallel to the surface of the substrate.

16. The method of claim 15, wherein the exit face comprises an optical element having a curved surface.

17. The method of claim 15, wherein at least one of the entrance face and the exit face comprises a grating.

18. The method of claim 15, wherein the light propagates through the resonant cavity from the entrance face to the exit face by total internal reflection between first and second sides of the block of the transparent material.

* * * * *

UNITED STATES PATENT AND TRADEMARK OFFICE
CERTIFICATE OF CORRECTION

PATENT NO. : 10,263,391 B2
APPLICATION NO. : 15/853800
DATED : April 16, 2019
INVENTOR(S) : Alexander Shpunt, Andrew J. Sutton and Yakov G. Soskind Page 1 of 1

It is certified that error appears in the above-identified patent and that said Letters Patent is hereby corrected as shown below:

In the Specification

In Column 4, Line 14, delete "beam axis 36" and insert -- beam axis 26 -- therefor.

In Column 9, Line 6, delete "beam axis 296" and insert -- beam axis 286 -- therefor.

Signed and Sealed this
Seventeenth Day of September, 2019

Andrei Iancu
*Director of the United States Patent and Trademark Office*